United States Patent
Hoskins et al.

(10) Patent No.: US 11,284,504 B2
(45) Date of Patent: Mar. 22, 2022

(54) POWER ELECTRONIC MODULE WITH INTEGRATED COOLING CHANNEL

(71) Applicant: Kostal of America, Inc., Troy, MI (US)

(72) Inventors: Steven R. Hoskins, Walled Lake, MI (US); Kenneth S. Koscielniak, Farmington Hills, MI (US)

(73) Assignee: Kostal of America, Inc., Troy, MI (US)

( * ) Notice: Subject to any disclaimer, the term of this patent is extended or adjusted under 35 U.S.C. 154(b) by 0 days.

(21) Appl. No.: 17/086,518

(22) Filed: Nov. 2, 2020

(65) Prior Publication Data

US 2021/0168930 A1    Jun. 3, 2021

Related U.S. Application Data

(60) Provisional application No. 62/930,641, filed on Nov. 5, 2019.

(51) Int. Cl.
*H05K 1/02* (2006.01)

(52) U.S. Cl.
CPC .................. *H05K 1/0209* (2013.01)

(58) Field of Classification Search
CPC .................................................. H05K 7/20927
See application file for complete search history.

(56) References Cited

U.S. PATENT DOCUMENTS

| | | | | |
|---|---|---|---|---|
| 8,867,210 | B2* | 10/2014 | Harmelink | H05K 7/20254 361/699 |
| 10,136,527 | B2* | 11/2018 | You | H05K 7/1417 |
| 2019/0320555 | A1* | 10/2019 | Flavin | H05K 5/069 |

* cited by examiner

*Primary Examiner* — Mukundbhai G Patel
(74) *Attorney, Agent, or Firm* — Gunther J. Evanina; Butzel Long, P.C.

(57) ABSTRACT

A power electronic module having reduced mass and/or reduced package size as compared with conventional modules employing die cast materials, secondary machining, and/or welding operations includes a housing, a discrete cooling channel positioned in the housing and having opposing cooling surfaces, and first and second printed circuit board assemblies disposed on opposite sides of the cooling channel.

19 Claims, 5 Drawing Sheets

POWER ELECTRONIC MODULE WITH INTEGRATED COOLING CHANNEL

CROSS-REFERENCE TO RELATED APPLICATION

This application claims priority to provisional Application No. 62/930,641, filed Nov. 5, 2019, which is incorporated herein by reference in its entirety.

FIELD OF THE DISCLOSURE

This disclosure relates to power electronics modules, and in particular to power electronics modules having integrated cooling channels.

BACKGROUND OF THE DISCLOSURE

Conventional power electronics modules generally utilize heavy and expensive liquid cooling channels that are typically machined into one side of the main housing of the module and welded closed to prevent leakage of cooling fluid. Because the cooling channels are machined into one side of the housing, a single printed circuit board is interfaced with the cooling surface of the cooling channels. As a consequence, a single large printed circuit board and a large cooling channel are employed in the conventional power electronics modules, with the module having a large package size due to the inability to stack printed circuit boards.

SUMMARY OF THE DISCLOSURE

The disclosed power electronic modules can have reduced mass as compared with conventional modules employing die cast materials, secondary machining operations, and/or welding operations. The disclosed power electronic modules can have a reduced package size as compared to conventional modules due to the ability to position printed circuit boards on opposite sides of a discrete cooling channel that is integrated into the module.

The power electronic modules of this disclosure include a housing, a discrete cooling channel positioned in the housing, the cooling channel having fluid inlet and outlet ports for flow of a coolant, and first and second printed circuit board assemblies positioned in the housing on opposite sides of the discrete cooling channel and being in thermal contact with opposite heat-absorbing surfaces of the discrete cooling channel.

In certain aspects of the disclosure, the housing has a partition defining a cutout section in which the discrete cooling channel is positioned, wherein the partition includes integral connectors that facilitate attachment of the cooling channel to the housing with retention brackets.

In certain aspects of this disclosure, the housing includes a core housing that is an injection molded thermoplastic port and further comprises an external housing and cover that together enclose the core housing, printed circuit board assemblies, and discrete cooling channel. The external housing and cover can be fabricated from stamped sheet metal (e.g., steel).

These and other advantages will be more fully appreciated in view of the following detailed descriptions.

DETAILED DESCRIPTION

Figure 1:
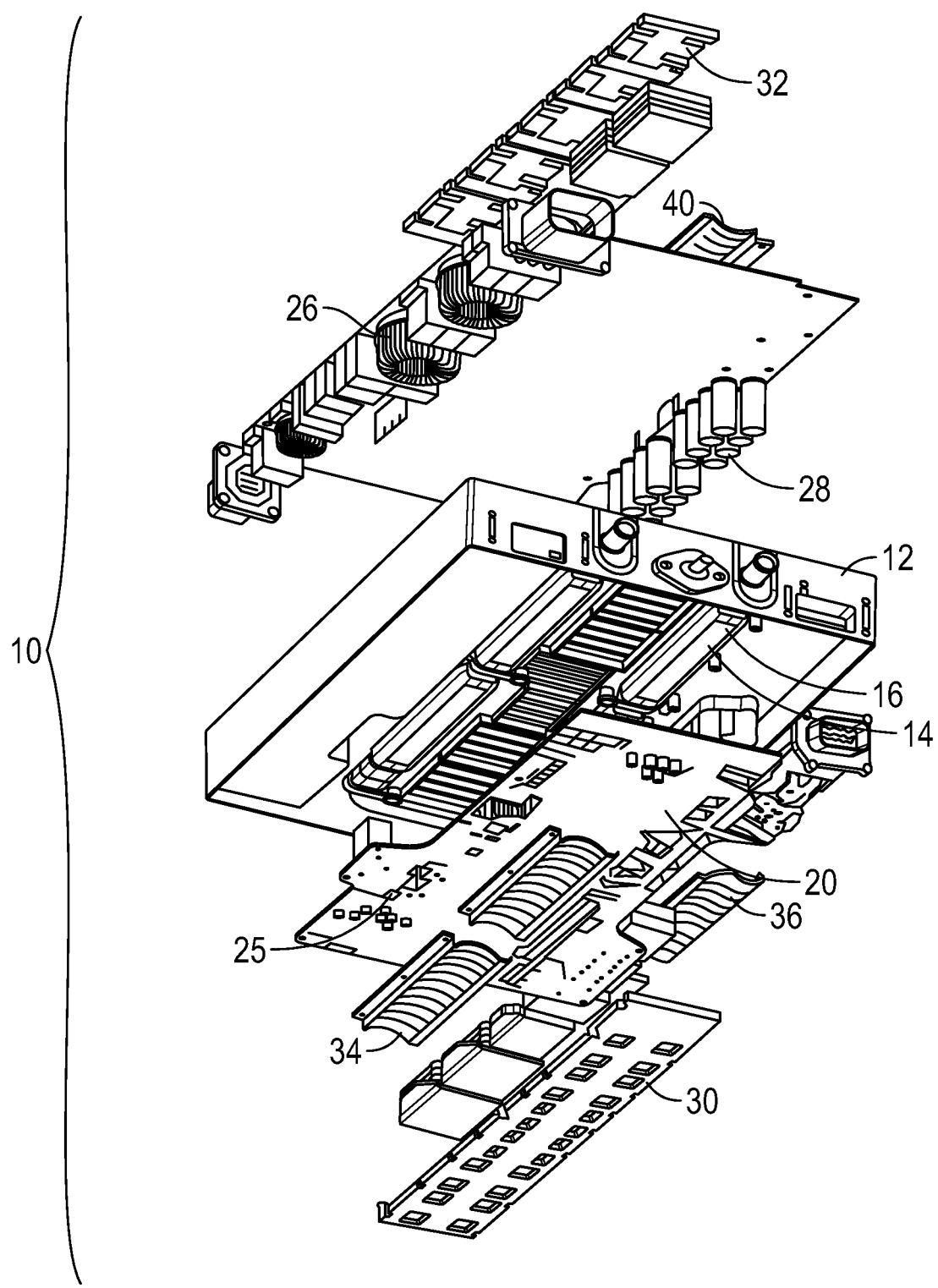
FIG. 1 is an exploded perspective view showing the relationship of the component of the disclosed power electronic module.
Figure 2:
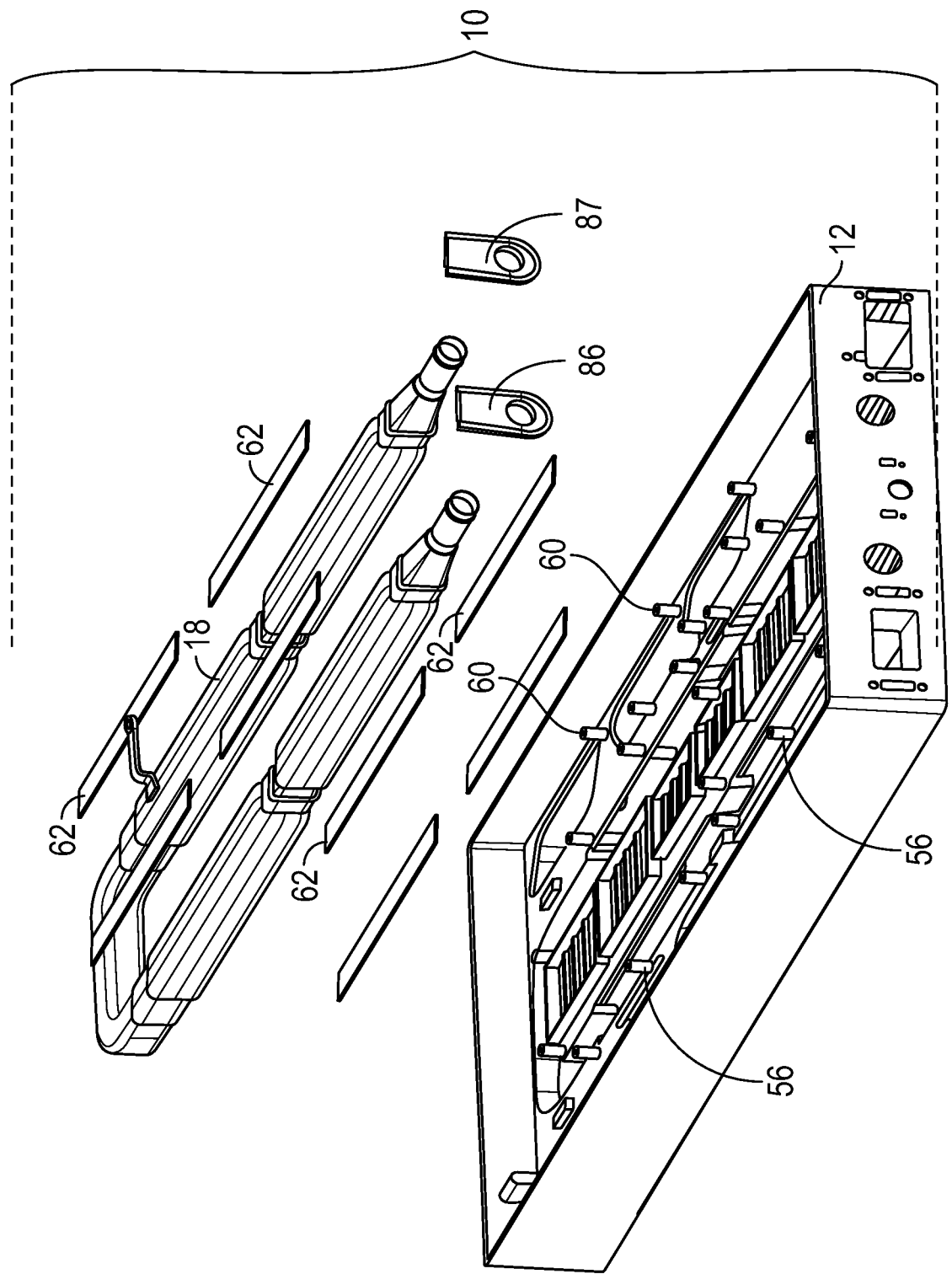
FIG. 2 is an exploded perspective view showing details of the discrete cooling channel and how it is assembled onto the core housing of the module of FIG. 1.

A liquid cooled power electronic device 10 is illustrated in FIGS. 1-5. FIG. 1 is an exploded view illustrating the relationship of various components of the device 10. Device 10 includes a core or mid-housing 12 configured to hold and retain a discrete cooling channel 14 having downwardly facing heat-absorbing surfaces 16 and opposing upwardly facing heat-absorbing surfaces 18 (FIG. 2) that thermally interface with first printed circuit board assembly 20 and second printed circuit board assembly 22, respectively, to allow heat to be absorbed and carried away by a coolant fluid circulating through discrete cooling channel 14.

Discrete cooling channel 14 is made separately from the core housing 12 and is secured to the core housing after fabrication rather than being machined into or formed as an integral part of the core housing. This allows the core housing 12 and cooling channel 14 to be made separately from different lightweight materials to reduce the mass of the device, and allows the opposing surfaces 16, 18 of the cooling channel 14 to be interfaced with two discrete printed circuit board assemblies 20, 22 arranged on opposite sides of the cooling channel (i.e., in a stacked arrangement), whereby a more compact device can be produced.

Smaller electronic components (e.g., components 25) can be surface mounted to the printed circuit boards and fully supported by the printed circuit board. Attachment of larger or taller electronic components, such as inductors 26 and tall capacitors 28 can be reinforced with brackets 30, 32 that can be secured to core housing 12.

Leaf springs 34, 36, 38 and 40 are securable to core housing 12 to urge printed circuit board assemblies 20 and 22 into thermal contact with the external heat-absorbing surfaces 16, 18 of cooling channel 14.

Figure 3:
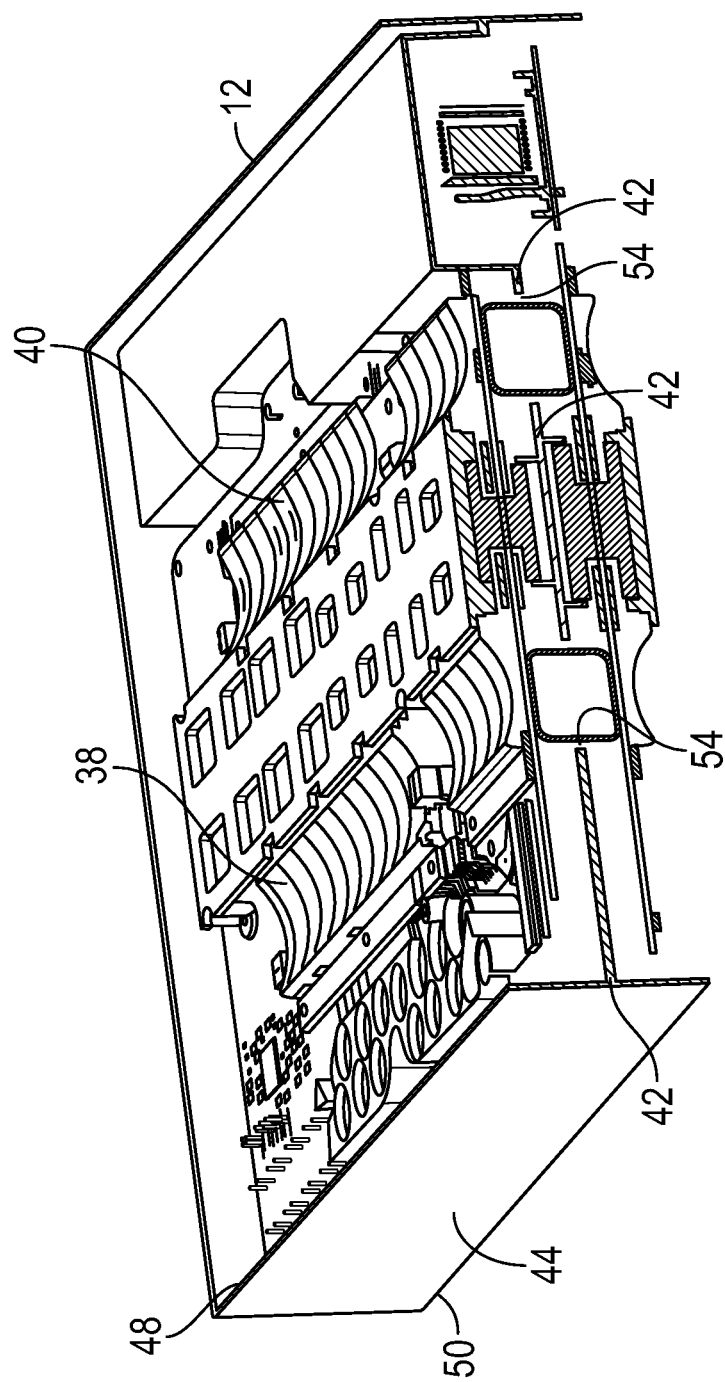
FIG. 3 is a cross-sectional perspective of the device of FIG. 1 in an assembled state.

As shown in the cross-sectional view in FIG. 3, core housing 2 includes a generally planar partition 42 extending from a sidewall 44 of core housing 12 toward an opposing sidewall 46 at an elevation approximately half way between an upper edge 48 and lower edge 50 of the sidewalls. Partition 42 includes a cutout 54 in which discrete cooling channel 14 is positioned.

Figure 4:
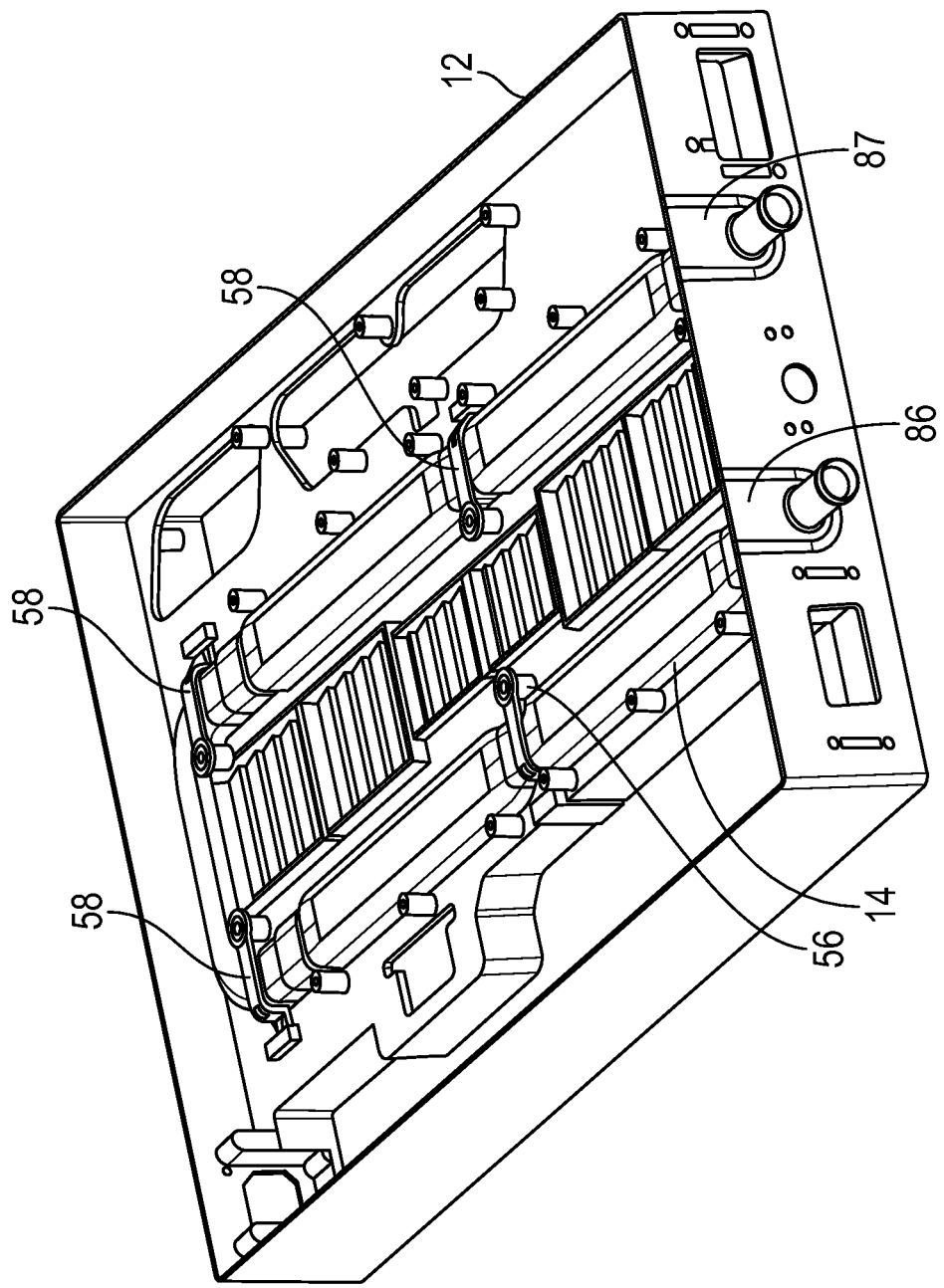
FIG. 4 is a top perspective view of the partially assembled device of FIGS. 1-3, showing retention brackets used to secure the cooling channel to the core housing.

As indicated by reference numeral 56, partition 42 of core housing 12 includes a plurality of connectors for securing cooling channel 14 in cutout 54 with retention brackets 58 (as shown in FIG. 4). Additional connectors 60 can be provided for securing printed circuit board assemblies 20, 22, leaf springs 34, 36, 38 and 40, and electronic component brackets 30, 32 to core housing 12. The connectors can be integrally formed with the core housing during an injection molding process. Alternatively, the connectors and core housing can be formed separately or together using a die-casting or sheet metal stamping process.

In order to enhance thermal contact between heated and/or heat-generating components of the device 10, thermal interface material 62 is disposed between and contacts both the printed circuit board assemblies 20, 22 and the associated heat-absorbing surfaces 16, 18 of discrete cooling channel 14. Thermal interface material 62 can be in the form of a thermally conductive tape, pad, sheet or paste, all of which are commercially available and commonly employed to enhance conductive heat transfer between surfaces. Suitable thermal interface materials include thermally conductive rubber materials that are employed in a sheet, strip or tape form.

Figure 5:
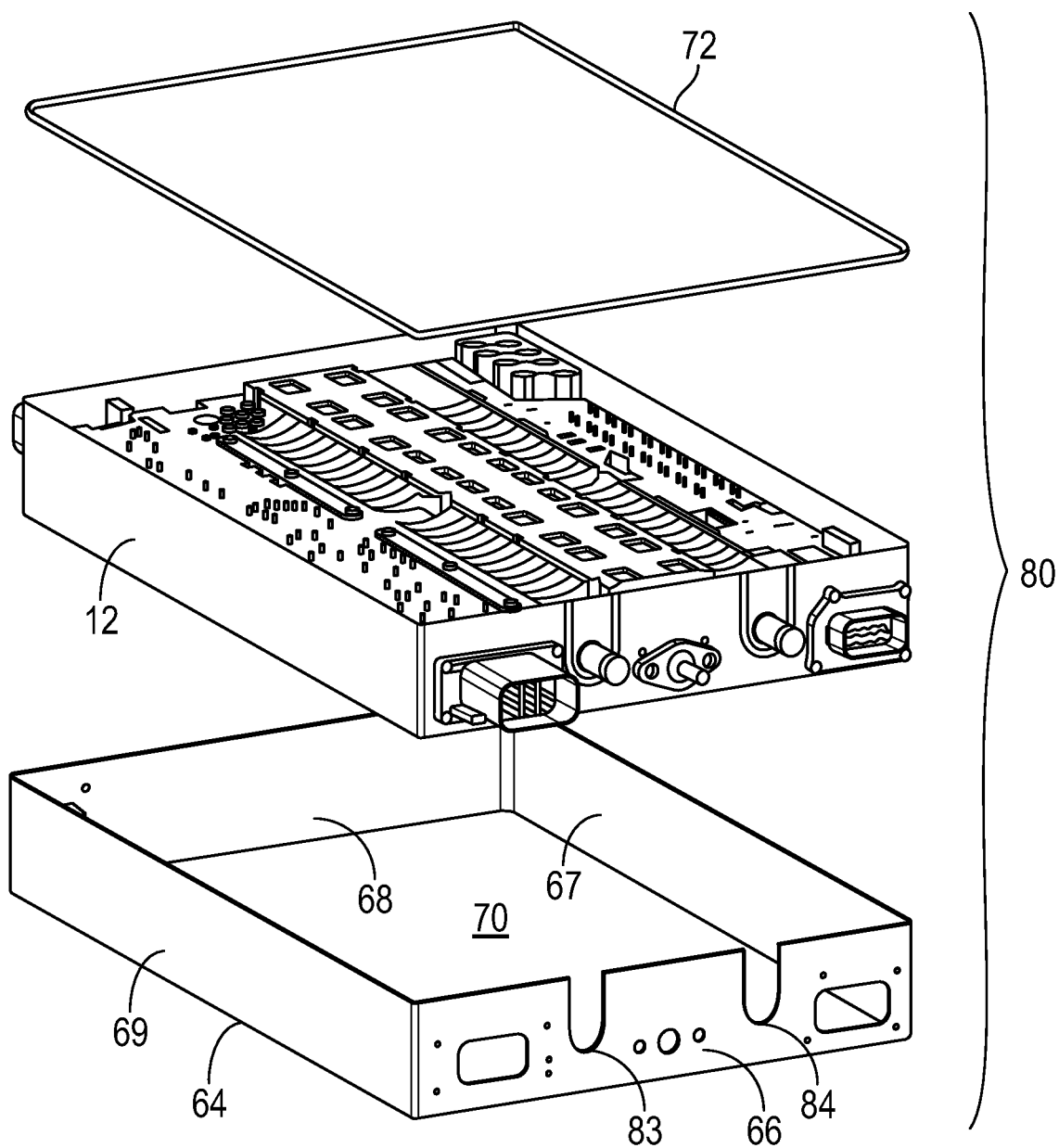
FIG. 5 is an exploded perspective view of the device of FIGS. 1-4, showing how the core housing on which the printed circuit board assemblies and cooling channel are mounted and encased in an external housing and cover.

As shown in FIG. 5, the core housing 12 is fitted into an external housing 64 having sidewalls 66, 67, 68 and 69 and a floor or bottom wall 70. A cover 72 can be attached (such as with screws) to external housing 64 such that core housing 12 and the various components mounted on the core housing are encased within the covered external housing to provide an enclosed assembly 80.

As shown in FIGS. 4 and 5, inlet port 80 and outlet port 82 of cooling channel 14 protrude or extend from the housing through slotted cutouts 83, 84 of external housing 64, which cutouts are closed off with grommets 86, 87.

The above description is intended to be illustrative, not restrictive. The scope of the invention should be determined with reference to the appended claims along with the full scope of equivalents. It is anticipated and intended that future developments will occur in the art, and that the disclosed devices, kits and methods will be incorporated into such future embodiments. Thus, the invention is capable of modification and variation and is limited only by the following claims.

What is claimed is:

1. A liquid cooled power electronic device, comprising:
a housing;
a discrete cooling channel disposed in the housing, the discrete cooling channel having a fluid coolant inlet and outlet passing through a wall of the housing;
a first printed circuit board assembly having a first circuit board defining electrically conductive pathways connecting electronic components mounted on the first circuit board, the first printed circuit board assembly thermally coupled to a first heat-absorbing surface on one side of the discrete cooling channel; and
a second printed circuit board assembly having a second circuit board defining electronically conductive pathways connecting electronic components mounted on the second circuit board, the second printed circuit board assembly thermally coupled to a second heat-absorbing surface on a second side of the discrete cooling channel;
wherein the housing has a generally planar partition having a plurality of integrally formed connectors for facilitating attachment of at least one of cooling body retention brackets, the printed circuit board assemblies, an electronic component bracket for retaining electronic components that are not mounted on the printed circuit board assemblies, and leaf spring assemblies for urging the printed circuit board assemblies into thermal contact with the heat-absorbing surfaces of the cooling body.

2. The device of claim 1, wherein thermal interface material is disposed between and contacts both the printed circuit board assemblies and the associated heat-absorbing surfaces of the discrete cooling channel.

3. The device of claim 2, wherein the thermal interface material is a thermally conductive tape, pad, sheet, or paste.

4. The device of claim 1, wherein the housing comprises a core housing on which the discrete cooling channel and printed circuit board assemblies are attached, and an external housing and cover that together define an enclosure for the core housing, discrete cooling body and printed circuit board assemblies.

5. The device of claim 4, wherein the core housing is made of thermoplastic material.

6. The device of claim 4, wherein the external housing and cover are made of stamped metal.

7. The device of claim 1, wherein the discrete cooling body is made of aluminum or copper.

8. The device of claim 1, further comprising cooling body retention brackets securing the discrete cooling body to the generally planar partition.

9. The device of claim 1, further comprising an electronic component bracket for retaining electronic components that are not mounted on either of the first and second printed circuit board assemblies.

10. The device of claim 1, wherein the printed circuit boards are secured by the integrally formed connectors to the housing.

11. The device of claim 1, wherein leaf springs are secured to the housing by the integrally formed connectors, and urge the printed circuit board assemblies into thermal contact with heat-absorbing surfaces of the discrete cooling channels.

12. The device of claim 1, wherein the generally planar partition includes a cutout section in which the discrete cooling channel is positioned.

13. The device of claim 1 wherein the device is an on-board charger for an electric vehicle.

14. The device of claim 1, wherein the device is an electronic control unit for an advanced driver-assistance system.

15. A liquid cooled power electronic device, comprising:
a core housing having sidewalls, a generally planar partition extending at least partially between the sidewalls to define first and second compartments within the housing, the partition having a cutout section;
a discrete cooling channel having a fluid inlet, a fluid outlet, and a fluid passageway between the fluid inlet and fluid outlet for circulating a coolant through the device, the discrete cooling channel disposed in the cutout section and having external surfaces for absorbing heat, the external heat-absorbing surfaces including a surface disposed within each of the compartments;
a first printed circuit board assembly having a plurality of electronic components mounted thereon and electrically connected by conductive pathways, the first printed circuit board assembly thermally coupled to a heat-absorbing surface disposed within the first compartment; and
a second printed circuit board assembly having a plurality of electronic components mounted thereon and electrically connected by conductive pathways, the second printed circuit board assembly thermally coupled to a heat-absorbing surface disposed within the second compartment;
wherein the housing has a generally planar partition having a plurality of integrally formed connectors for facilitating attachment of at least one of cooling body retention brackets, the printed circuit board assemblies, an electronic component bracket for retaining electronic components that are not mounted on the printed circuit board assemblies, and leaf spring assemblies for urging the printed circuit board assemblies into thermal contact with the heat-absorbing surfaces of the cooling body.

16. The device of claim 15, wherein the discrete cooling channel is made of aluminum or copper, the core housing is made of a thermoplastic material, and the device further comprises an external housing and cover that together enclose the core housing, discrete cooling body and printed circuit board assemblies.

17. The device of claim 16, wherein thermal interface material is disposed between and contacts both the printed circuit board assemblies and associated heat-absorbing surfaces of the discrete cooling channel.

18. The device of claim 17, wherein the generally planar partition has a plurality of integral connectors connecting the printed circuit boards and discrete cooling channel to the core housing.

19. The device of claim 16, wherein the external housing and cover are comprised of a stamped metal sheet material.

\* \* \* \* \*